(12) United States Patent
Shimomura

(10) Patent No.: US 8,058,694 B2
(45) Date of Patent: Nov. 15, 2011

(54) SEMICONDUCTOR DEVICE

(75) Inventor: Hiroshi Shimomura, Osaka (JP)

(73) Assignee: Panasonic Corporation, Osaka (JP)

( * ) Notice: Subject to any disclaimer, the term of this patent is extended or adjusted under 35 U.S.C. 154(b) by 1101 days.

(21) Appl. No.: 11/812,291

(22) Filed: Jun. 18, 2007

(65) Prior Publication Data

US 2008/0122014 A1 May 29, 2008

(30) Foreign Application Priority Data

Jun. 19, 2006 (JP) .................... 2006-168935

(51) Int. Cl.
*H01L 27/088* (2006.01)
(52) U.S. Cl. ............ 257/401; 257/365; 257/153
(58) Field of Classification Search .......... 257/153, 257/241, 365, 401
See application file for complete search history.

(56) References Cited

U.S. PATENT DOCUMENTS

| | | | |
|---|---|---|---|
| 5,869,352 A | 2/1999 | Maruyama et al. | |
| 6,177,293 B1 | 1/2001 | Netzer et al. | |
| 6,601,224 B1 | 7/2003 | Kiss et al. | |
| 6,893,925 B2 | 5/2005 | Kiss et al. | |
| 6,951,789 B2 | 10/2005 | Voshell et al. | |
| 2003/0036236 A1 | 2/2003 | Benedetto et al. | |

FOREIGN PATENT DOCUMENTS

| | | |
|---|---|---|
| JP | 10-214971 | 8/1998 |
| JP | 3276325 | 8/1998 |

OTHER PUBLICATIONS

Shimomura, H., et al., "A Mesh Arrayed MOSFET (MA-MOS) for High-Frequency Analog Applications", Symposium on VLSI Technology Digest of Technical Papers, Jun. 1997, pp. 73-74.
Hayashi, G., et al., "A 9mW 900MHz CMOS LNA with Mesh Arrayed MOSFETs", Symposium on VLSI Circuits Digest of Technical Papers, Jun. 1998, pp. 84-85.

*Primary Examiner* — Michael B Shingleton
(74) *Attorney, Agent, or Firm* — McDermott Will & Emery LLP

(57) ABSTRACT

In a semiconductor device, such as a MOSFET or the like, which is a high-frequency LSI achieving a low noise figure and a high maximum oscillation frequency and which has unit cells with a ring-shaped gate electrode arranged in an array, gate drawing wires connecting together the gate electrode and gate contact pad portions are arranged on a region excluding a drain region and a source region, that is, on an isolation region. Bending portions of the ring-shaped gate electrode are all formed on the isolation region. This therefore permits an improvement in high frequency characteristics such as noise, the maximum oscillation frequency, and the like while eliminating unnecessary gate capacity addition, and also permits small characteristic variation even if a machining shape of the bending portions of the gate electrode is unstable.

21 Claims, 14 Drawing Sheets

SEMICONDUCTOR DEVICE

CROSS REFERENCE TO RELATED APPLICATIONS

This non-provisional application claims priority under 35 U.S.C. §119(a) on Patent Application No. 2006-168935 filed in Japan on Jun. 19, 2006, the entire contents of which are hereby incorporated by reference.

BACKGROUND OF THE INVENTION

1. Technical Field

The present invention relates to a device structure of a MOSFET having excellent high-frequency characteristics.

2. Related Art

In recent years, the mobile communication market has been expanding due to increasing demand, system sophistication, and widened applicability of mobile communication technology, and it is estimated that the market size of mobile communication services and appliances can reach 11 trillion yen in 2010. Accordingly, great expectation is put on transistors and ICs capable of handling frequency bands in the GHz region, which is suitable for use in communication appliances, mobile radio base stations, satellite communication, broadcast stations, and the like. Conventionally, as high-frequency analog devices handling these objects, GaAs ICs, silicon bipolar transistors, and BiCMOS LSIs have been mainly used.

However, in the mobile communication, in view of achieving low-price and low power consumption demanded by users or achieving a system downsized by a one-chip analog-digital hybrid LSI, there have been increasing market demands on high-performance, high-frequency LSIs provided by a CMOS.

A MOSFET in terms of a high-frequency analog silicon device, when compared with a bipolar transistor (hereinafter referred to as BJT), has the following characteristics.

(1) Possible High Integration

Compared to the BJT, the MOSFET can be subjected to microfabrication and occupies a smaller area on the chip.

(2) Low Distortion Characteristic

The current-voltage characteristic of the BJT is an exponential characteristic while that of the MOSFET is a square-law characteristic. Thus, adjacent higher harmonics $2f1 \pm f2$ and $2f2 \pm f1$ do not appear.

(3) High Gain and High Efficiency

Optimization of dimensions (gate width and gate length) of the MOSFET provides high gain and high efficiency. This can reduce the number of module stages, thus permitting a reduction in size and price of the LSI.

Next, performance requirements imposed on the high-frequency silicon MOSFET will be described.

(1) Improvement in Transconductance gm

To apply the MOSFET to a high-frequency LSI circuit, large transconductance gm needs to be provided for high gain.

A drain current Id of the MOSFET can be expressed by the following formula:

$$Id = \tfrac{1}{2} * W/L \times \mu n \times Cox \times (Vgs - Vt)^2 \qquad (1).$$

Thus, the transconductance gm can be expressed as follows:

$$gm = dI/dV = (2\mu n \times Cox \times Id \times W/L)^{0.5} \qquad (2).$$

Here, μn represents electron mobility, Cox represents gate oxide film capacity per unit area, and W and L represent the gate width and the gate length, respectively. When the current is fixed, the W/L ratio needs to be increased to increase the transconductance gm.

(2) Improvement in a Cutoff Frequency fT

The cutoff frequency fT represents a frequency at which the current gain is 1, and one of indexes expressing high frequency characteristics of the device. This requires a margin of approximately ten times the operating frequency.

The cutoff frequency fT of the FET can be expressed by formula below:

$$fT = gm/2\pi(Cgs + Cdg) \qquad (3).$$

The cutoff frequency fT is proportional to the transconductance gm and inversely proportional to the sum of the gate-source capacity Cgs and the drain-gate capacity Cdg.

Miniaturization of the gate length L permits achieving equivalent performance with a smaller gate width W, thus leading to system downsizing and cost reduction.

(3) Noise Reduction

To apply the MOSFET to a high-frequency LSI, it is required to reduce noise of the FET itself so that a faint input signal is not buried in noise.

Minimum noise figure NFmin in a region where the sum of gate resistance Rg and source resistance Rs (Rg+Rs) is large can be approximately expressed by formula below:

$$NFmin = 1 + 2\pi fKCgs\sqrt{(Rg+Rs)/gm} \qquad (4).$$

This formula is known as Fukui formula, where K is a constant number.

This formula proves that a transistor with larger transconductance gm, smaller gate resistance Rg, and smaller source resistance Rs has lower noise.

(4) Improvement in a Maximum Oscillation Frequency

The maximum oscillation frequency $f_{max}$ is a frequency at which power gain is 0, and can be expressed as in formula (5):

$$f_{max} = fT/2\sqrt{(Rg(1/W) \times (Rds \times 2\pi fT \times Cgd + Cgs(Ri+Rs))} \qquad (5).$$

As can be seen from the formula (5), the maximum oscillation frequency $f_{max}$ is larger with smaller gate resistance Rg and smaller source resistance Rs. Although not expressed in the formula (5), it is also known that the maximum oscillation frequency $f_{max}$ is larger with smaller source inductance Ls.

In a conventional high-frequency LSI, for the purpose of improving these high frequency characteristics, a salicide process capable of simultaneously making the resistance of the gate, source, and drain low, or a polycide process of making the resistance of only the gate electrode low has been applied to a conventional finger-type transistor. In future, a metal gate or the like will also be applied.

As has been described hereinbefore, it can be understood that the performance of the MOSFET in high-frequency applications is greatly dependent on device parasitic components such as the gate resistance, source resistance, gate and drain capacities, and the like. To achieve reduction in these parasitic components, work has been done on the layout structure.

Among these, as a MOSFET for achieving in particular a low noise figure and a high maximum oscillation frequency and also achieving higher function and lower cost of a high-frequency LSI applied to a mobile communication appliance or the like, there is proposed "a structure in which unit cells symmetrical about a center point thereof and each having a ring-shaped gate electrode are arranged in an array" by patent document 1 (Japanese Patent Application Laid-open No. 3276325) and non-patent document 1 (Symposium on VLSI Technology held on June 1997, "A Mesh-Arrayed MOSFET (MA-MOS) for High-frequency analog Applications" (by Hiroshi Shimomura, et al.)), and further non-patent document 2 (Symposium on VLSI Circuits held on June 1998, "A 9 mW 900 MHz CMOS LNA with mesh arrayed MOSFETs" (by Joji Hayashi, et al.)). This structure is meeting with reports proving the validity thereof at international conferences and the like, where the structure is referred to as "Mesh-Arrayed MOSFET (MA-MOS)". FIG. 18 shows a structure in which a ring-shaped gate electrode included in a unit cell is octagon-shaped. FIG. 19 shows a structure in which a ring-shaped gate electrode included in a unit cell is quadrangle-shaped.

Patent document 2 (U.S. Pat. No. 6,601,224) and patent document 3 (U.S. Pat. No. 6,893,925) disclose technology of constructing a transistor by arranging a plurality of linear electrical conductors of a predetermined width serving as gate electrodes in the lateral direction and longitudinal direction, also forming a source region or a drain region in a region surrounded by these liner electrical conductors, and further rendering an inactive region each inter portion of the linear electrical conductors, which are arranged in the lateral direction and the longitudinal direction. As a result, the transistor achieved by this technology is configured to have a plurality of quadrangular ring-shaped gate electrodes provided in the lateral direction and the longitudinal direction.

In the transistor having the ring-shaped gate electrode structured as described above, when a unit transistor (unit cell) is formed with one ring-shaped gate electrode and a source region and a drain region respectively located inside and outside the ring-shaped gate electrode, forming a gate contact region for connecting a wire to the ring-shaped gate electrode described above and connecting together this gate contact region and the ring-shaped gate electrode described above with the gate drawing wire for each unit transistor can stabilize a voltage applied to the ring-shaped gate electrode or the like.

However, the transistors disclosed in patent document 1 and non-patent documents 1 and 2 described above suffer from the following drawbacks as shown in FIGS. 18 to 21. Hereinafter, these drawbacks will be described. FIGS. 18 to 21, in which a region inside the rectangular or octagonal ring-shaped gate electrode 1 is provided as, for example, a drain region 2, a region outside thereof is provided as, for example, a source region 3, two or four gate contact regions 6 are provided, and these gate contact regions 6 and the ring-shaped gate electrode 1 are connected together with gate drawing wires 5, clearly prove that the gate drawing wires 5 cross the active region 3 in any of the layouts. Consequently, unnecessary gate capacities Cgd and Cgs are added, which presents the drawback of inhibiting an improvement in the high frequency characteristics, such as noise and the maximum oscillation frequency in particular, as indicated in the formulae (4) and (5) provided for "performance requirements imposed on the high-frequency silicon MOSFET" described above.

The presence of a portion of the gate drawing wire 5 not drawn out, if any, results in the presence of a region where the gate electrode 1 is bent and a machining shape of the gate at this portion becomes unstable, thus presenting the drawback that a MOSFET with little characteristic variation cannot be provided.

On the other hand, patent documents 2 and 3 do not at all disclose that gate contact regions and gate drawing wires are provided on an individual unit transistor basis.

SUMMARY OF THE INVENTION

It is a first object of the present invention to eliminate unnecessary gate capacity addition and to improve high frequency characteristics including noise, the maximum oscillation frequency, and the like in a semiconductor device, such as a MOSFET or the like, having unit cells with ring-shaped gate electrodes arranged in an array.

Further, it is a second object of the present invention to, in addition to achieving the first object described above, reduce characteristic variation even when a machining shape of a bending portion of the gate electrode is unstable.

To achieve the objects described above, in the present invention, in a semiconductor device, such as a MOSFET or the like, having a ring-shaped gate electrode, gate drawing wires are arranged outside of an active region, that is, on an isolation region and connected to the ring-shaped gate electrode.

In the present invention, in addition to the configuration described above, a bending portion of the ring-shaped gate is also formed on the isolation region.

Specifically, a semiconductor device according to the invention includes a plurality of unit cells formed on a semiconductor substrate. Each of the unit cells includes: a ring-shaped gate electrode; a first diffusion region formed in a region inside of the ring-shaped gate electrode and serving as a drain region or a source region; a second diffusion region formed in a region outside of the ring-shaped gate electrode and serving as a source region or a drain region; an isolation region provided in a region adjacent to the second diffusion region; a gate contact pad portion provided on the isolation region; and a gate drawing wire for connecting together the ring-shaped gate electrode and the gate contact pad portion, all of the gate drawing wire being arranged on the isolation region.

In one embodiment of the present invention, the semiconductor device further includes: a drain or source contact formed on the first diffusion region; a source or drain contact formed on the second diffusion region; and a gate contact formed on the gate contact pad portion.

In one embodiment of the semiconductor device of the present invention, the ring-shaped gate electrode is formed into a completely closed ring shape.

In one embodiment of the semiconductor device of the present invention, the ring-shaped gate electrode is cut on the isolation region to be thereby formed into an open ring shape.

In one embodiment of the semiconductor device of the present invention, the unit cell further includes: a substrate contact semiconductor region whose conductive type is opposite to a conductive type of the first and second diffusion regions; and a substrate contact formed on the substrate contact semiconductor region.

In one embodiment of the semiconductor device of the present invention, an area of the first diffusion region is set small such that only one drain or source contact can be formed on the first diffusion region and drawn out therefrom.

In one embodiment of the semiconductor device of the present invention, the ring-shaped gate electrode has a bending portion.

In one embodiment of the semiconductor device of the present invention, the bending portion of the ring-shaped gate electrode is located on the isolation region.

In one embodiment of the semiconductor device of the present invention, a number of the source or drain contact formed on the second diffusion region is four or larger.

In one embodiment of the semiconductor device of the present invention, an area of the second diffusion region is set larger than an area of the first diffusion region.

In one embodiment of the semiconductor device of the present invention, an area of the gate contact pad portion is set large so that a plurality of gate contacts can be formed.

In one embodiment of the semiconductor device of the present invention, an area of the gate contact pad portion is set small so that only a single gate contact can be formed.

In one embodiment of the semiconductor device of the present invention, the ring-shaped gate electrode, the gate drawing wire, and the first and second diffusion regions in each unit cell are rotationally symmetrical about a center point of the ring-shaped gate electrode on the semiconductor substrate.

In one embodiment of the semiconductor device of the present invention, in each of the plurality of unit cells, two gate contact pad portions are formed at mutually opposing positions across the first diffusion region, and the gate drawing wires are formed of two gate drawing wires connecting together the ring-shaped gate electrode and two gate contact pad portions, and the plurality of unit cells are in orderly arrangement so that the semiconductor device as a whole has symmetry.

In one embodiment of the present invention, the semiconductor device further includes: substrate contact semiconductor regions formed at mutually opposing positions across the first diffusion region, the opposing positions being different from the positions of the two gate contact pad portions, the substrate contact semiconductor regions having a conductivity type opposite to a conductive type of the first and second diffusion regions; and substrate contacts formed on the substrate contact semiconductor regions.

In one embodiment of the semiconductor device of the present invention, the ring-shaped gate electrode, the gate drawing wires, and the first and second diffusion regions in each unit cell are rotationally symmetrical about a center point of the ring-shaped gate electrode on the semiconductor substrate.

In one embodiment of the semiconductor device of the present invention, at least one of the plurality of unit cells is arranged at a 90 degree rotation from an adjacent unit cell.

In one embodiment of the present invention, the source or drain contact includes a plurality of source or drain contacts, and the semiconductor device further includes a source or drain contact wire connecting together the source or drain contacts formed on the second diffusion region. The source or drain contact wire is formed over a region excluding the drain or source contact formed on the first diffusion region and a surrounding area thereof and the gate contact formed on the gate contact pad portion and a surrounding area thereof.

In one embodiment of the present invention, the semiconductor device further includes a source or drain contact-substrate contact wire connecting together the source or drain contact formed on the second diffusion region and the substrate contacts formed on the substrate contact semiconductor regions.

In one embodiment of the present invention, the semiconductor device further includes: substrate contact semiconductor regions provided only in some unit cells of the plurality of unit cells each located at a surrounding area of the semiconductor device, the substrate contact semiconductor regions having a conductive type opposite to a conductive type of the first and second diffusion regions; substrate contacts each formed on the substrate contact semiconductor regions; and a substrate contact wire connecting together the substrate contacts.

In one embodiment of the semiconductor device of the present invention, the plurality of unit cells formed on the semiconductor substrate function as a high-frequency signal amplification FET.

Based on the above, in the present invention, in a semiconductor device, such as a MOSFET or the like, having a large number of unit cells each provided with a ring-shaped gate electrode, gate drawing wires never extend across an active region, and thus unnecessary gate capacities Cgd and Cgs are never added accordingly. Therefore, further improvement in high frequency characteristics can be achieved.

In particular, in the present invention, bending portions of the gate electrode, where a machining shape is unstable, lie outside of the active region not directly related to transistor operation, thus permitting formation of a MOSFET with small variation in the gate width. Further, for example, employing a square shape for the ring-shaped gate electrode in the unit cell secures a configuration with a stable four-way gate, thus forming anywhere on the semiconductor substrate a unit cell averagely undergoing a two-way process fluctuation (e.g., in formation of the source region and the drain region, an ion implantation process for threshold control, gate machining dimension gradient). Thus, variation characteristics are uniform among a large number of unit cells and their characteristics almost match with each other, thus permitting formation of a MOSFET with a favorable matching characteristic.

DETAILED DESCRIPTION OF THE PREFERRED EMBODIMENTS

The preferred embodiments of the present invention will be described below with reference to the accompanying drawings.

First Embodiment

Figure 1:
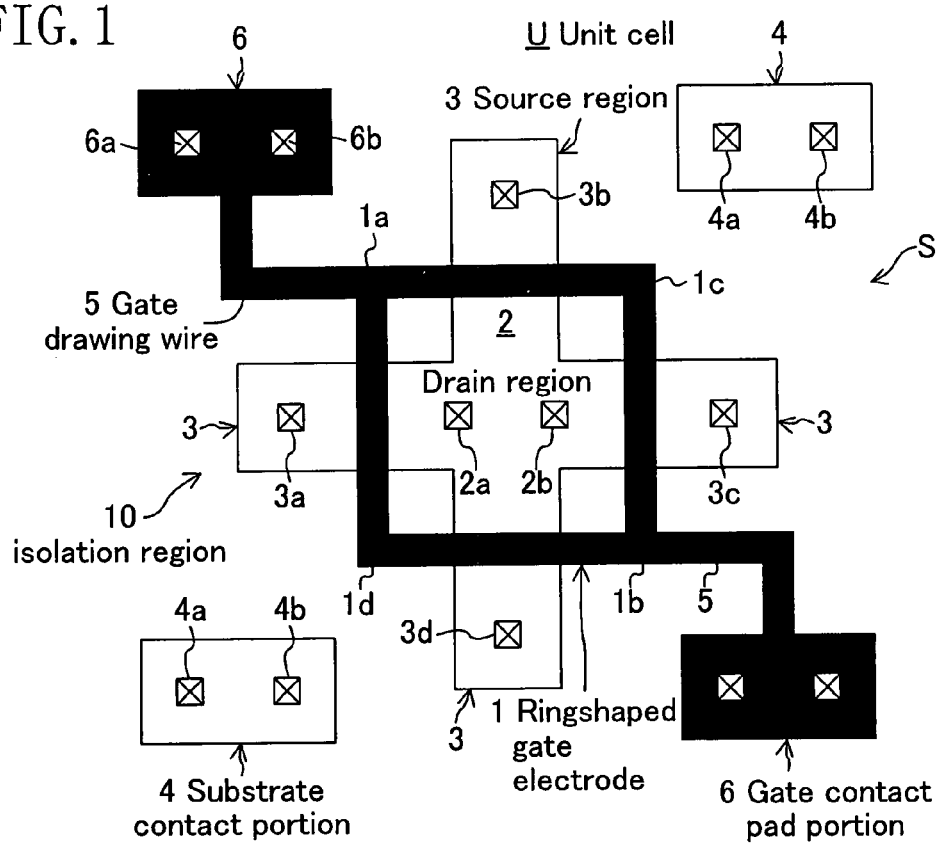
FIG. 1 is a plan view showing a general layout configuration of a unit cell of a MOSFET according to a first embodiment of the present invention.
Figure 2:
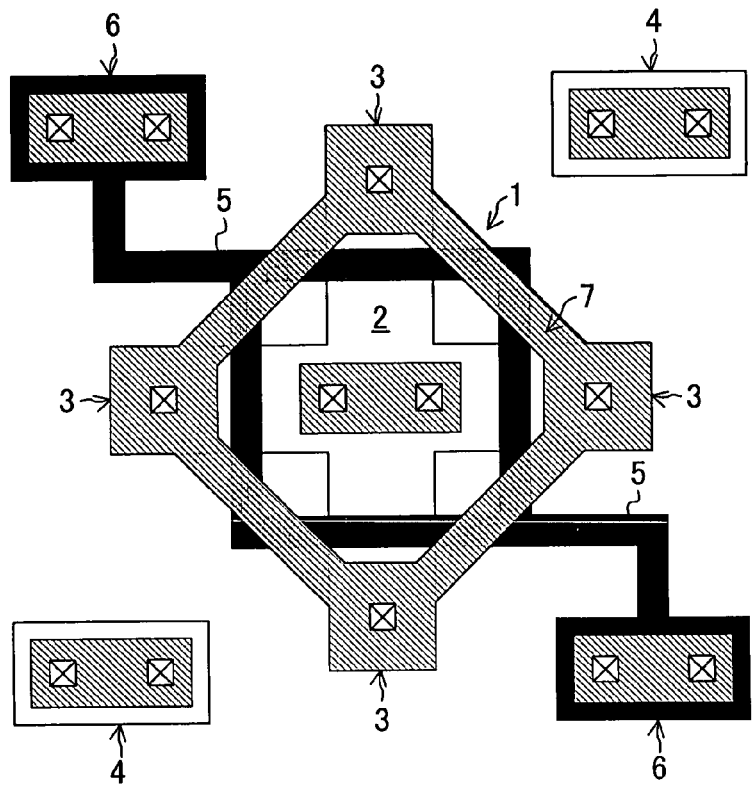
FIG. 2 is a plan view of the same unit cell with a wiring layout added thereto.
Figure 3:
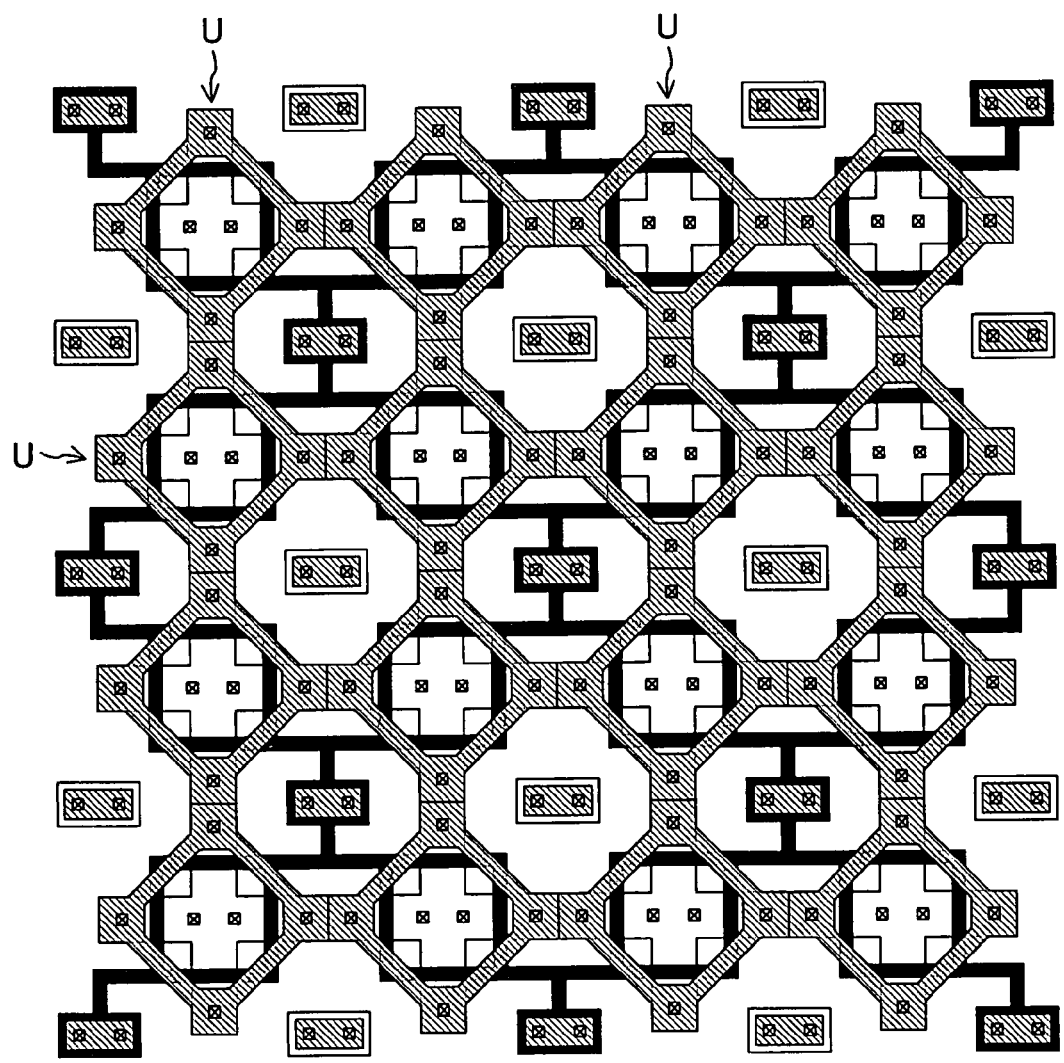
FIG. 3 is a plan view showing a general layout of a MOSFET formed of the same unit cells arranged in a matrix form.

FIG. 1 is a plan view schematically showing a layout configuration of a unit cell of a MOSFET as a semiconductor device according to the first embodiment of the present invention. FIG. 2 is a diagram showing the unit cell of FIG. 1 with a first layer wire added thereto. FIG. 3 is a plan view showing a cell array structure of the entire MOSFET referring to the unit cell structure shown in FIG. 2 as an example, and such a MOSFET functions as, for example, a high-frequency signal amplification FET. A large number of unit cells are formed and arranged laterally and longitudinally in an orderly manner in FIG. 3, and only one of these unit cells is shown in FIG. 1.

In the unit cell U of FIG. 1, on a semiconductor substrate S of silicon, a transistor is formed with a cross-shaped active region being formed in a region surrounded by an isolation region 10 of a separating insulating film and with the center of this active region being surrounded by a square ring-shaped gate electrode 1 via a gate oxide film, not shown.

The active region inside of the ring-shaped gate electrode 1 is a drain region (first diffusion region) 2 while the active region outside of the ring-shaped gate electrode 1 is a source region (second diffusion region) 3. The total area of this source region 3 is set larger than the area of the drain region 2. Further, as an independent active region, substrate contact portions 4 are formed. The drain region 2 and source region 3 are doped with highly concentrated impurities of the same conductivity type. The active region below the ring-shaped gate electrode 1 (that is, below the gate oxide film) serves as a channel region doped with impurities whose concentration is at a threshold control level and whose conductivity type is opposite to that of the impurities in the source region 3 and the drain region 2. The substrate contact portions 4 is doped with highly concentrated impurities whose conductivity type is the same as that of the impurities in the channel region and opposite to that of the impurities in the source region 3 and the drain region 2.

In the square forming the ring-shaped gate electrode 1 described above, bending portions 1a to 1d at an upper left corner, a lower right corner, an upper right corner, and a lower left corner, respectively; as viewed in the figure are located outside of the first and second diffusion regions 2 and 3, that is, on the isolation region 10. From the bending portions 1a and 1b at the upper left corner and lower right corner, respectively, of the ring-shaped gate electrode 1, gate drawing wires 5 are respectively drawn out. Between these gate drawing wires 5 and the silicon semiconductor substrate S, a gate oxide film, not shown, formed of a silicon oxide film lies. Instead of the silicon oxide film, a silicon nitride film, a silicon oxynitride film, or any of other gate insulating films formed of what is called a high-k material may be used.

On a diagonal line linking together the bending portions 1a and 1d at the upper left corner and lower right corner, respectively, as viewed in the figure of the ring-shaped gate electrode 1, at mutually opposing positions on the isolation region 10 across the drain region 2, two gate contact pad portions 6 are arranged. To these gate contact pad portions 6, the gate drawing wires 5 are respectively connected. The area of each of these two gate contact pad portions 6 is set large such that two gate contacts 6a and 6b can be provided thereon. On the center of the drain region 2, two drain contacts 2a and 2b are provided, while a total of four source contacts 3a, 3b, 3c, and 3d are provided on the source region 3. Further, on a diagonal line linking together bending portions 1c and 1d at the upper right corner and lower left corner, respectively, as viewed in the figure of the ring-shaped gate electrode 1, on the isolation region 10, two substrate contact portions (substrate contact semiconductor regions) 4 are arranged, each of which is provided with two substrate contacts 4a and 4b. The aforementioned contacts are connected to wires formed thereabove and thereby electrically connected to the ring-shaped gate electrode 1, the drain region 2, the source region 3, and the substrate contact portions 4 inside the MOSFET. FIG. 2 shows how these contacts are connected to the above wires. The unit cell U shown in FIG. 1, as can be seen from this figure, is rotationally symmetrical about the center point of the ring-shaped gate electrode 1.

Therefore, with the structure of one unit cell of the MOSFET of the present embodiment, the entire two gate drawing wires 5 respectively drawn out from the upper left corner and lower right corner, as viewed in the figure, of the square forming the ring-shaped gate electrode 1 are arranged outside of the active regions 2 and 3, that is, on the isolation region 10 and respectively connect together the ring-shaped gate electrode 1 and the gate contact pad portions 6. Thus, the gate drawing wires 5 never extend across the active regions 2 and 3. Therefore, compared to a case where the gate drawing wires 5 extend across the active regions 2 and 3, unnecessary gate capacities Cgd and Cgs are not added, thereby permitting an improvement in high frequency characteristics.

Figure 20:
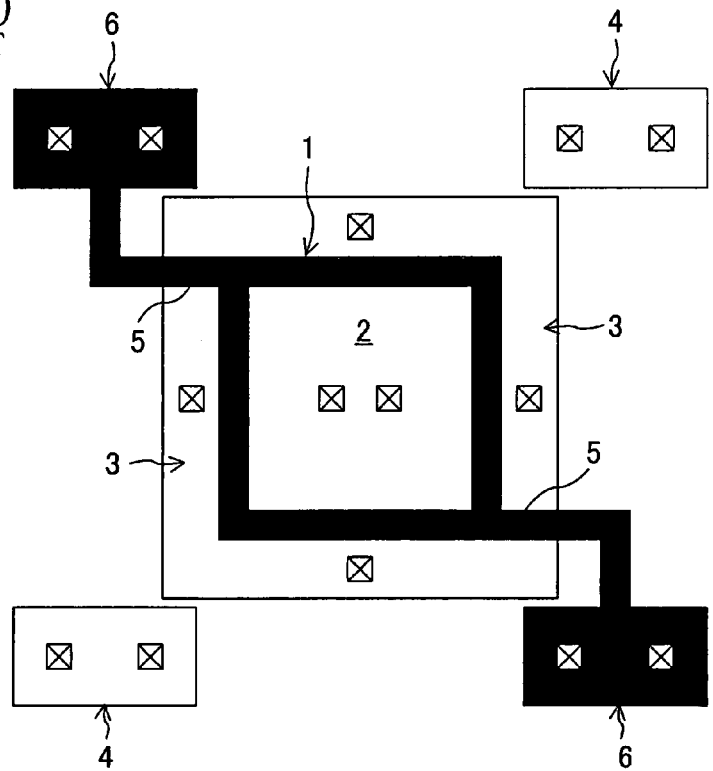
FIG. 20 is a plan view showing a general layout of still another unit cell of the conventional MOSFET.
Figure 21:
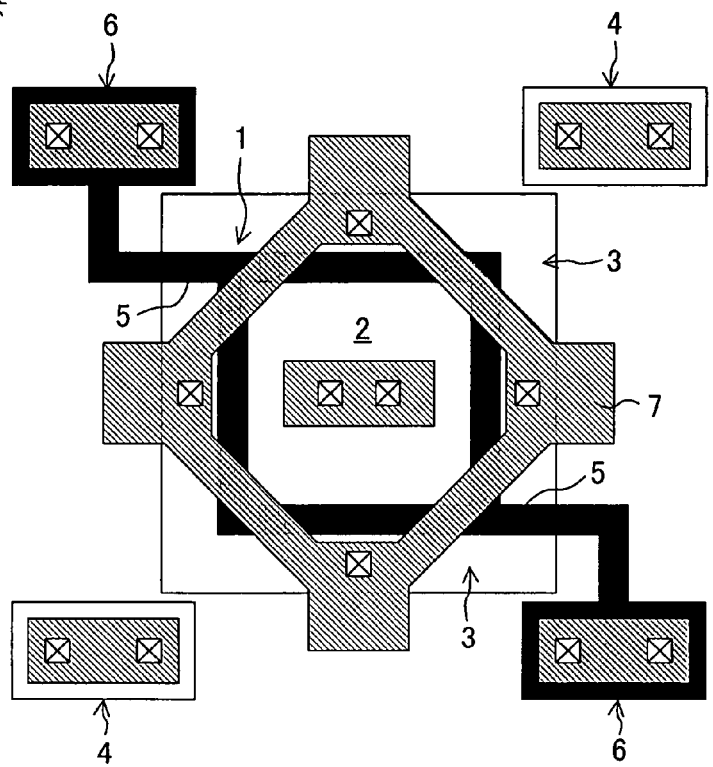
FIG. 21 is a plan view of the general layout shown in FIG. 20 with wiring layout added thereto.

On the other hand, in a MOSFET having the structure of a conventional square ring-shaped gate electrode shown in FIG. 20 and disclosed in patent document 1, gate drawing wires 5 pass through above a source region 3 as an active region and then reach gate contact pad portions 6. Portions at the lower left corner and upper right corner of the ring-shaped gate electrode 1 where the gate drawing wires 5 are not drawn out exist as portions where the gate electrode is bent at 90 degrees. A machining shape of the gate electrode at these portions is unstable, resulting in large variation in both the gate width and the gate length.

However, in the present embodiment shown in FIG. 1, the portions 1a to 1d bent at 90 degrees lie outside of the active regions 2 and 3 which is not directly related to the transistor operation (that is, on the isolation region 10). Thus, the MOSFET is formed with small manufacturing variation in both the gate width and the gate length. Further, for the square ring-shaped gate electrode 1 shown in FIG. 1, the unit cell U is configured to reliably have a stable two-way gate. Thus, anywhere on the semiconductor substrate, a transistor is formed which averagely undergoes two-way process fluctuation (in formation of the source region and the drain region, an ion implantation process for threshold control, gate machining dimension gradient, and the like). Therefore, the MOSFET can be formed with small variation fluctuation and a favorable matching characteristic.

The shape of the ring-shaped gate electrode 1 need not be a square but may be a rectangle.

Figure 4:
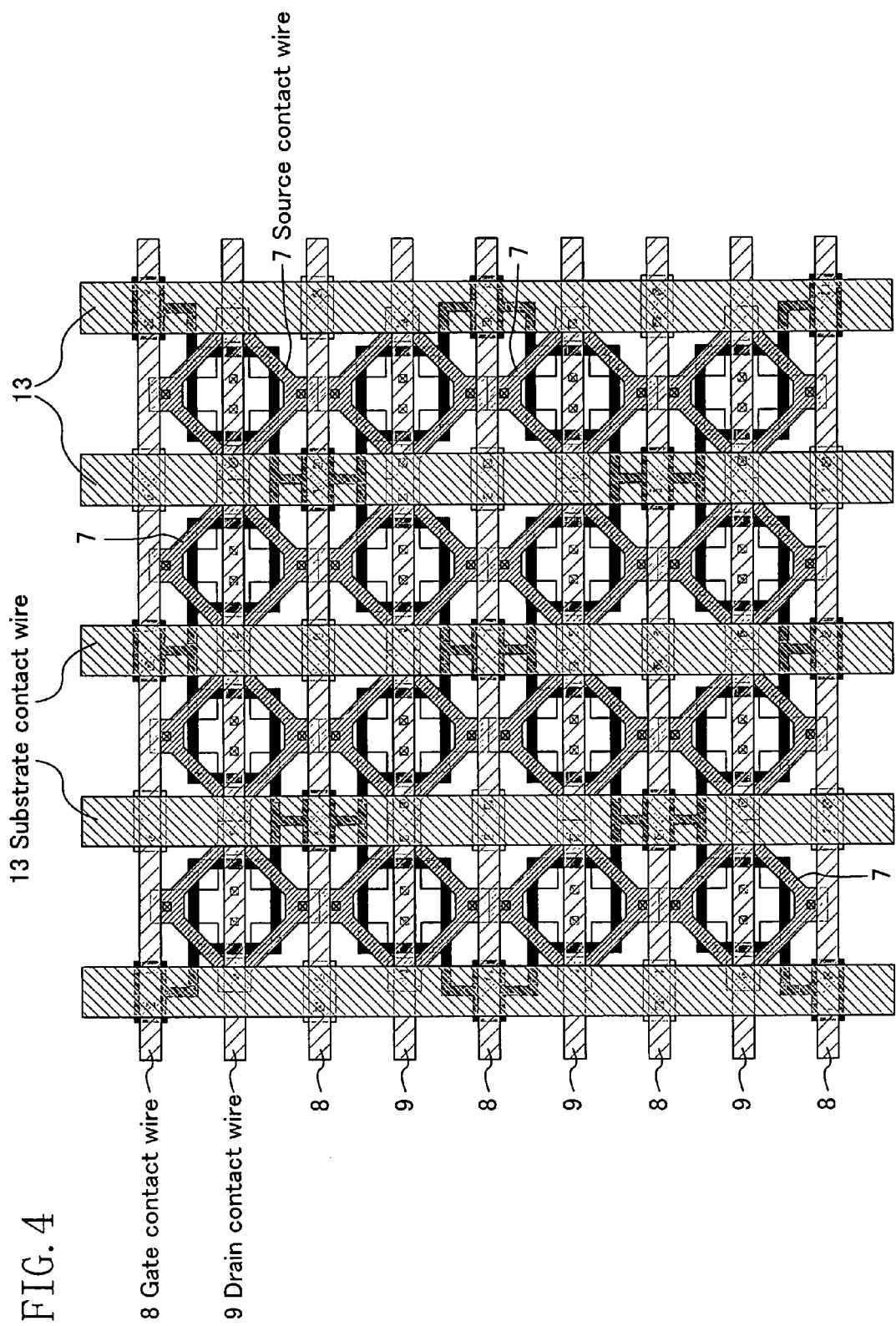
FIG. 4 is a plan view showing a general layout of the MOSFET shown in FIG. 3 with wires added thereto.

Next, the structure of the MOSFET formed of the unit cells U arranged in a matrix form will be described. FIG. 3 is a plan view showing a general layout of the MOSFET formed of the unit cells U of the present embodiment arranged in a matrix form. FIG. 4 is a plan view of the configuration of FIG. 3 with connecting wires for respective terminals being further added thereto. Within the active region surrounded by the isolation region 10, four unit cells U each in the longitudinal and lateral direction, that is, a total of 16 unit cells are arranged. The number of these unit cells is determined by a gate width W required for circuit characteristics.

In the MOSFET shown in FIG. 3, the 16 unit cells U are in orderly arrangement in a matrix form, have symmetry as a whole, and any one of the unit cells U is so arranged as to be formed in a state in which another unit cell U adjacent to the aforementioned unit cell U is rotated through 90 degrees about the center point of the ring-shaped gate electrode 1. In the MOSFET shown in FIG. 4, gate contact wires 8 and drain contact wires 9 are so arranged as to extend in the lateral direction as viewed in the figure, and substrate contact wires 13 are arranged on a wiring layer thereabove so as to extend in the longitudinal direction as viewed in the figure.

The MOSFET of the present embodiment has its single unit cell U so structured as to be in twofold-symmetry about the center point of the ring-shaped gate electrode 1 (that is, the center point of the drain region 2), thus making it easy to form a MOSFET with unit cells arranged in a matrix form with minimum loss of space. To achieve the required gate width, it is only required to add unit cells U.

Figure 5:
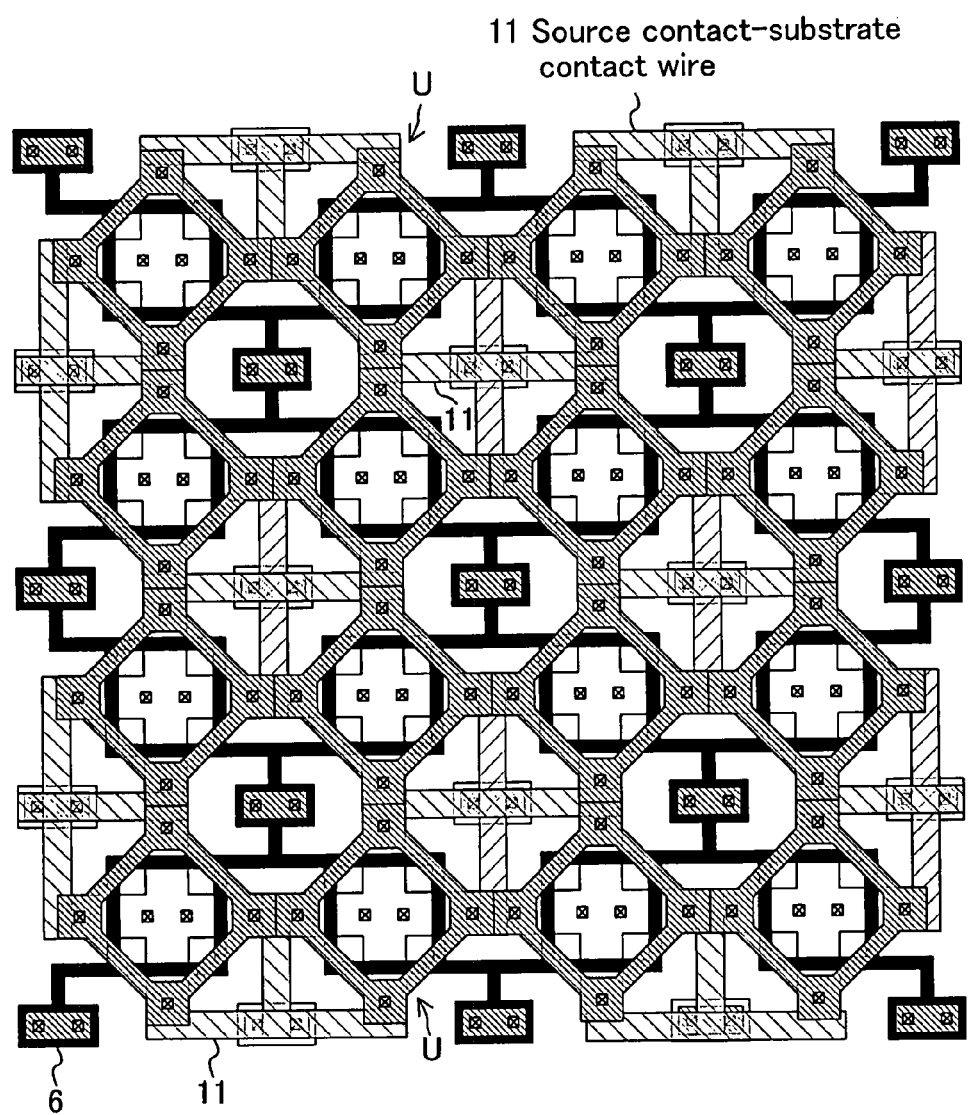
FIG. 5 is a plan view showing a modified embodiment of the general layout shown in FIG. 4.

In FIGS. 2 and 3, source contact wires 7 and substrate contact wires 13 are arranged separately from each other, thus making it possible to set the source potential and the substrate potential at different potentials. Alternatively, when these source potential and substrate potential are set at the same potential, as shown in FIG. 5, source contact-substrate contact wires 11 may be provided which standardize the source contact wires 7 and the substrate contact wires 13.

Figure 6:
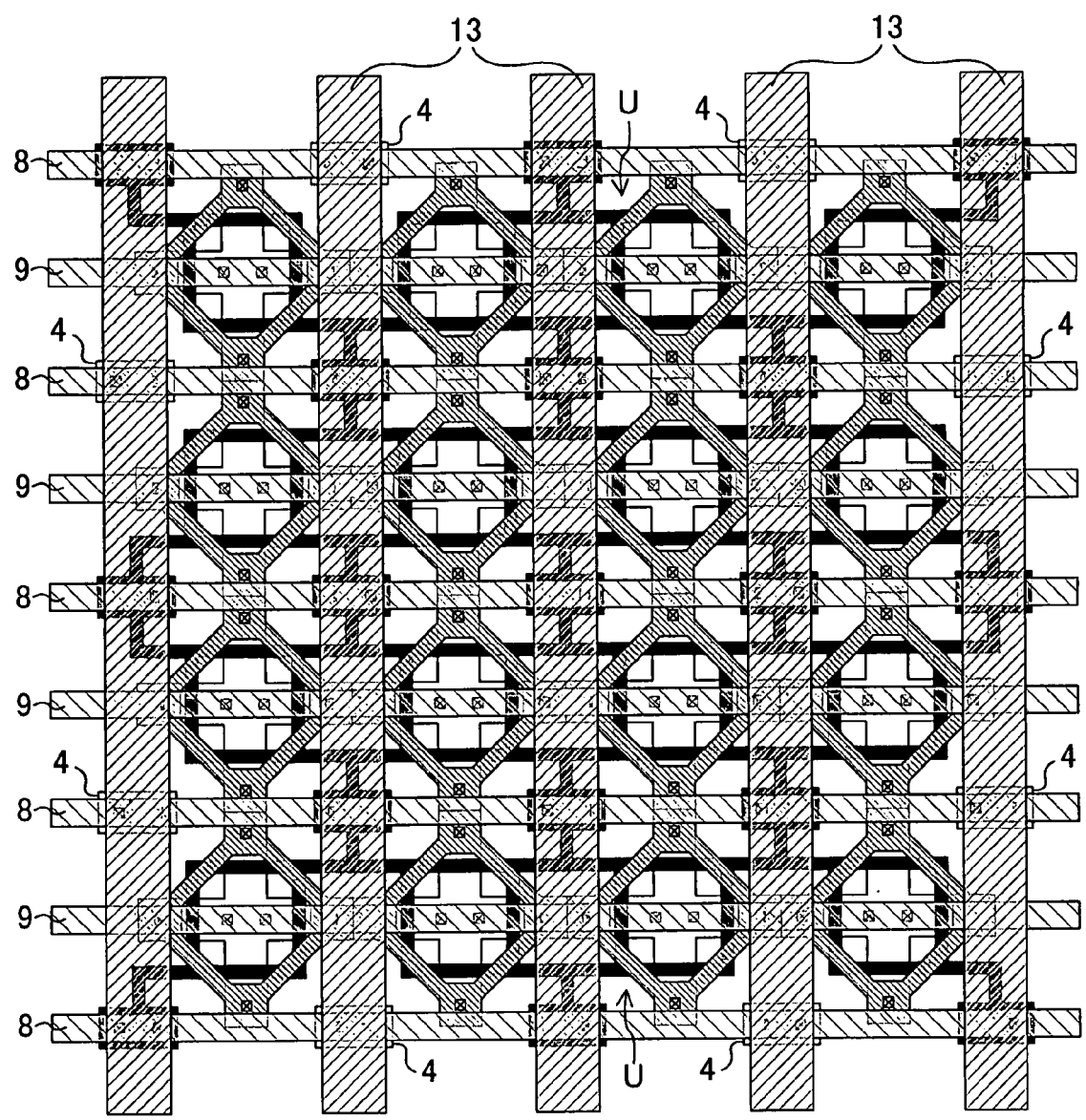
FIG. 6 is a plan view showing another modified embodiment of the general layout shown in FIG. 4.

Further, in FIGS. 1 to 3, the substrate contact portions 4 are arranged on the diagonal line linking together the upper right corner 1c and the lower left corner 1d of the square of the ring-shaped gate electrode 1 in each unit cell U. Alternatively, as shown in FIG. 6, the substrate contact portions 4 may be arranged in only those of a large number of unit cells U arranged in a matrix form which are located at the outer circumference.

Second Embodiment

Figure 7:
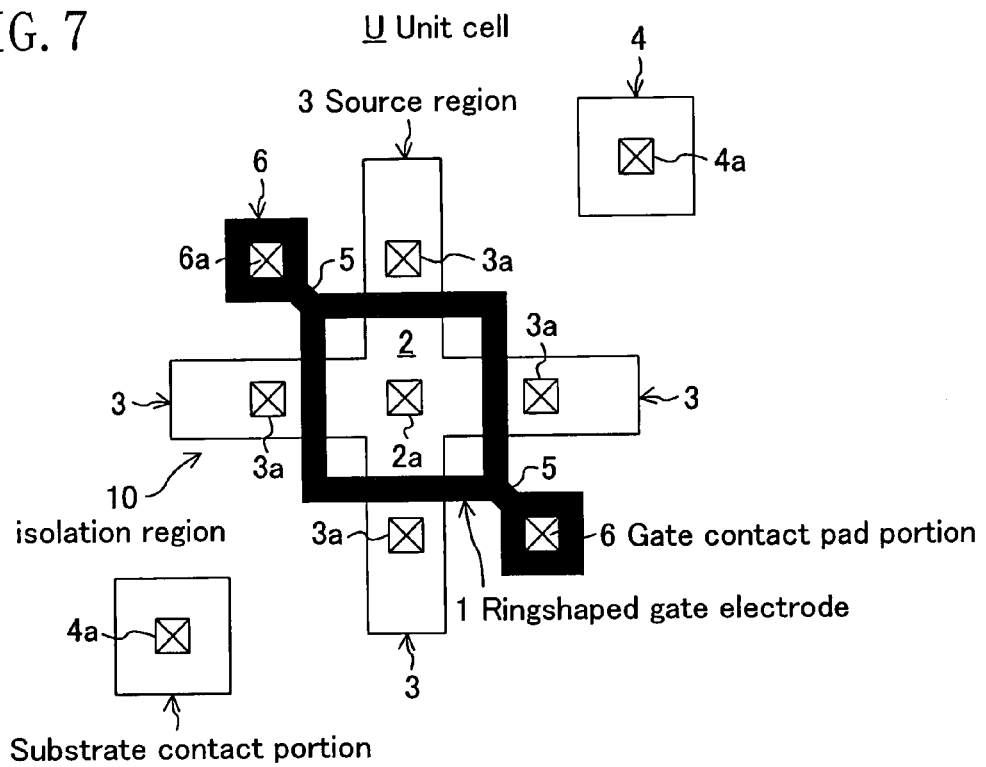
FIG. 7 is a plan view showing a general layout configuration of a unit cell of a MOSFET according to a second embodiment of the present invention.
Figure 8:
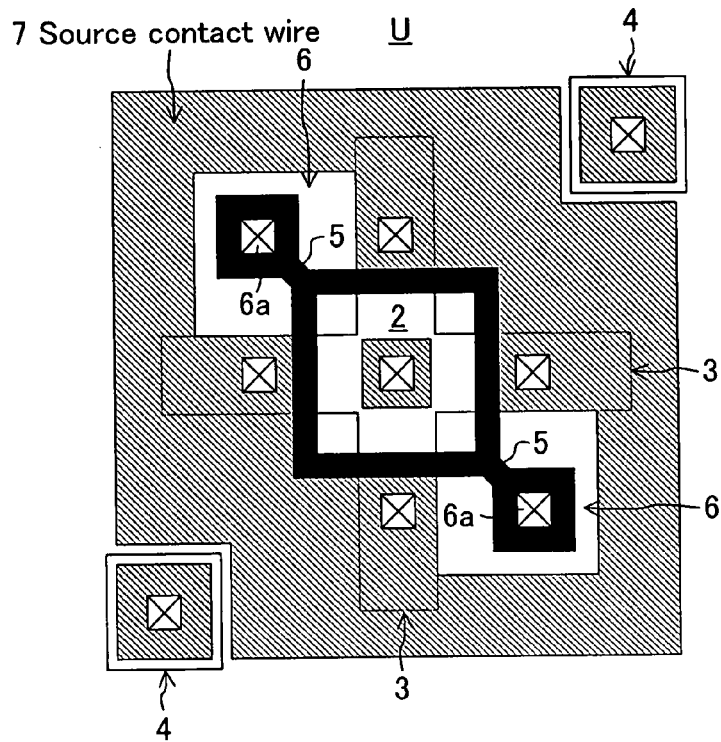
FIG. 8 is a plan view of the same unit cell with a wiring layout added thereto.

FIG. 7 is a plan view schematically showing a layout of a unit cell U of a MOSFET according to the second embodiment of the present invention. FIG. 8 is a diagram of FIG. 7 with a first layer wire added thereto. FIG. 7 is a plan view illustrating the structure of the unit cell U according to the present embodiment, for the purpose of showing the cell array structure of the MOSFET according to the present embodiment.

This structure locates the gate electrode 1 in FIG. 1 at such a position that diminishes the gate drawing wires 5 to the minimum. In the unit cell U shown in FIG. 7, a drain region 2 has an area set small such that only one drain contact 2a can be formed thereon, and four source regions 3 each have one source contact 3a formed thereon, so that four source contacts 3a are provided per unit cell U. Two gate contact pad portions 6 each have an area set small such that only one gate contact 6a can be provided thereon. FIG. 7 shows the layout of the unit cell U achieved in a minimum possible size within design rules, with the transistor formed in a manner, as in the first embodiment, such that a square ring-shaped gate electrode 1 surrounds the center of a cross-shaped active region. As shown in FIG. 8, source contact wires 7 are formed all over a region excluding the drain contact 2a of the drain region 2 and its surrounding area and the gate contacts 6a of the gate contact pad portions 6 and their surrounding areas.

Therefore, also in this second embodiment, the gate drawing wires 5 described in the first embodiment are formed on an isolation region 10. Thus, the MOSFET can be formed with small variation in both the gate width and the gate length, as shown in the first embodiment. Further, the unit cell U is configured to reliably have a stable two-way gate. Thus, anywhere on the semiconductor substrate, a transistor is formed which averagely undergoes two-way process fluctuation (in formation of the source region and the drain region, an ion implantation process for threshold control, gate machining dimension gradient, and the like). Therefore, the MOSFET can be formed with small variation fluctuation and a favorable matching characteristic.

In the present embodiment, the area of the drain region 2, which is defined by the square ring-shaped gate electrode 1, is made small such that only one drain contact 2a can be formed thereon and then drawn out therefrom, thereby minimizing the length in the side direction of the ring-shaped gate electrode 1. Moreover, the gate drawing wires 5 are drawn out from two places of the ring-shaped gate electrode 1 to provide the two gate contact pad portions 6, thus permitting effective reduction in gate resistance Rg. That is, optimization of the circumferential length of the ring-shaped gate electrode 1 so as to reduce a product of the gate resistance and the gate capacity (that is, high-frequency loss) to a minimum possible value can reduce the minimum noise figure $NF_{min}$ and the maximum oscillation frequency $f_{max}$.

Figure 9:
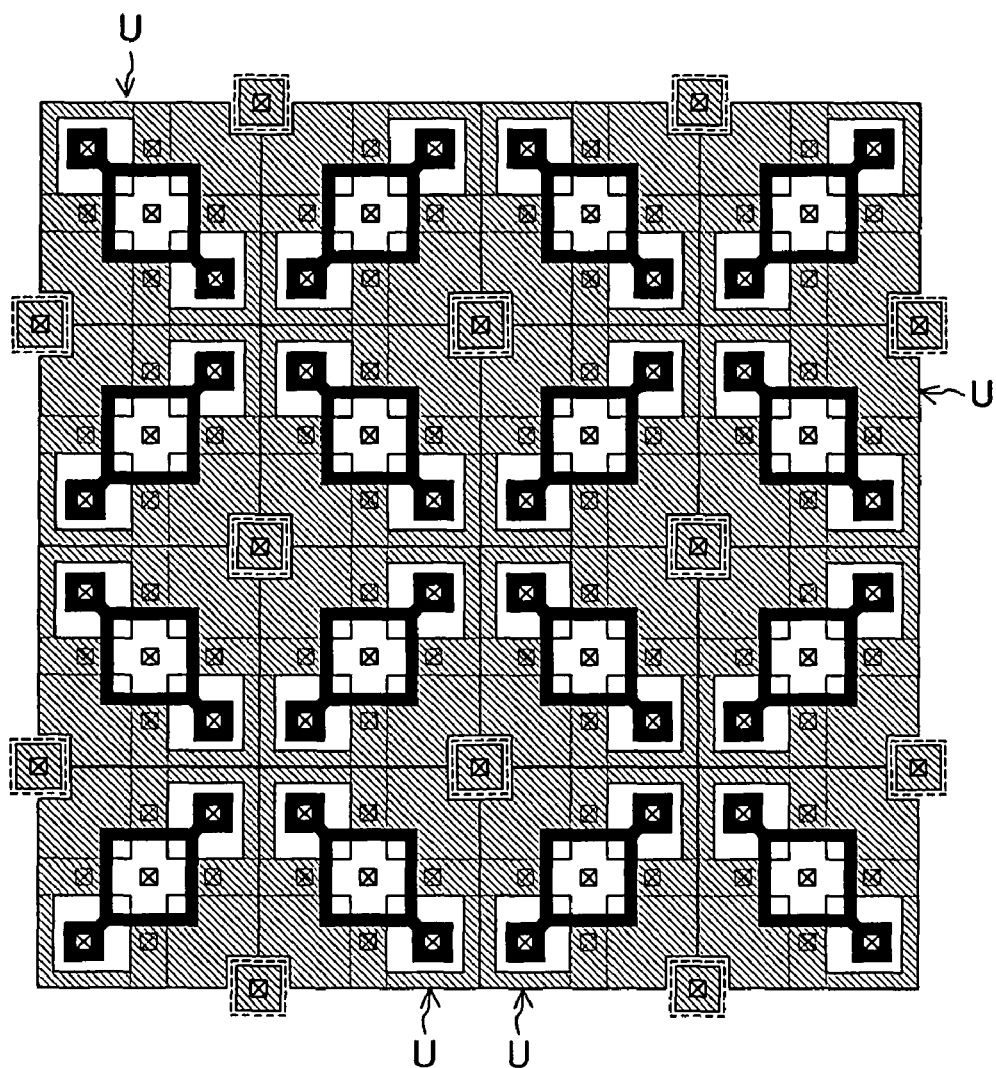
FIG. 9 is a plan view showing a general layout of a MOSFET formed of the same unit cells arranged in a matrix form.
Figure 10:
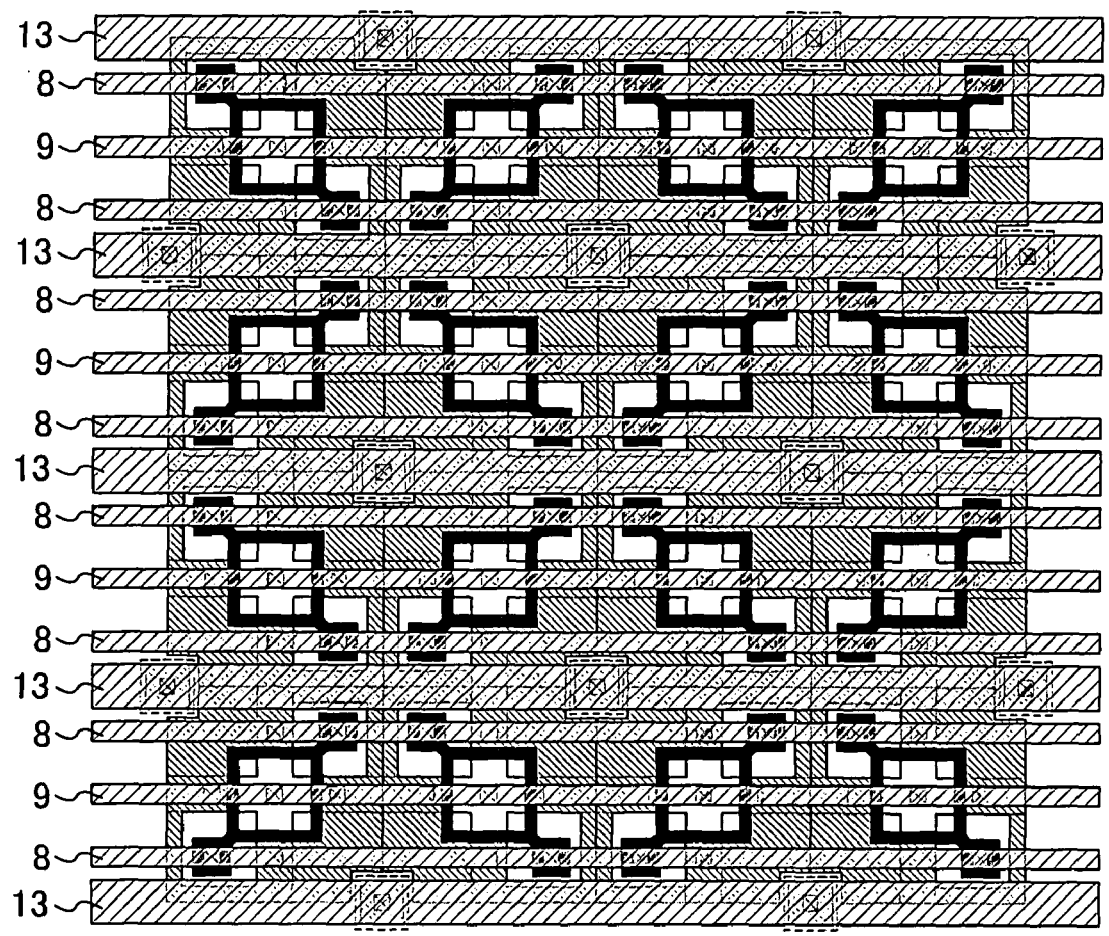
FIG. 10 is a plan view showing a general layout of the MOSFET shown in FIG. 9 with wires added thereto.

Next, the structure of the MOSFET formed of the aforementioned unit cells U arranged in a matrix form will be described. FIG. 9 is a plan view showing a general layout of the MOSFET formed of the unit cells U of the present embodiment arranged in a matrix form. FIG. 10 is a plan view of FIG. 9 with connecting wires for respective terminals being further added thereto. In the active region surrounded by the isolation region 10, four unit cells U each in the longitudinal and lateral directions, that is, 16 unit cells in total are arranged. The number of these unit cells U is determined by a gate width W required for circuit characteristics. In the second embodiment, positions of the gate contact pad portions 6 are located inside of the corresponding positions in the first embodiment, which permits the terminals to be provided with simpler connecting wires.

Figure 11:
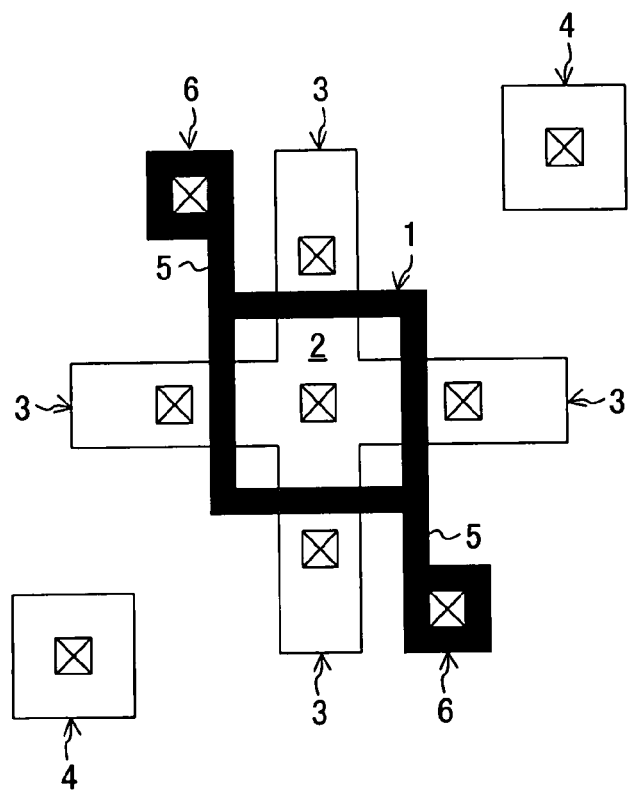
FIG. 11 is a plan view showing a first modified embodiment of the unit cell of the MOSFET shown in FIG. 7.
Figure 12:
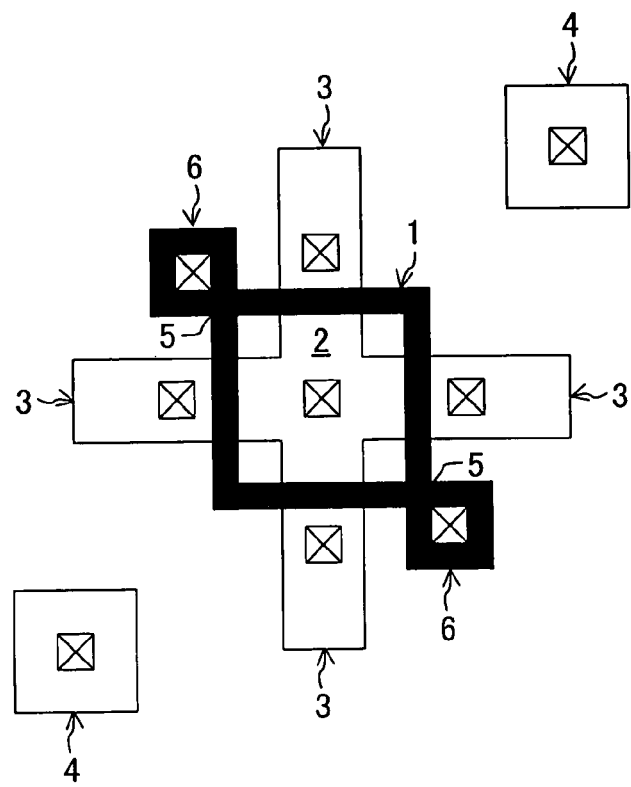
FIG. 12 is a plan view showing a second modified embodiment of the unit cell of the same MOSFET.

In this second embodiment, as shown in FIGS. 7 and 8, on a diagonal line linking together an upper left corner and a lower right corner of the square of the ring-shaped gate electrode 1, the two gate contact pad portions 6 are arranged. Alternatively, it is of course possible that these gate contact pad portions 6 are arranged above the upper left corner of the square of the gate electrode 1 as viewed in this figure and below the lower right corner thereof as viewed in the figure, as shown in FIG. 11. It is further possible that the gate contact pad portions 6 are so arranged as to be superimposed on the upper left corner and lower right corner of the square of the ring-shaped gate electrode 1, as shown in FIG. 12.

Figure 13:
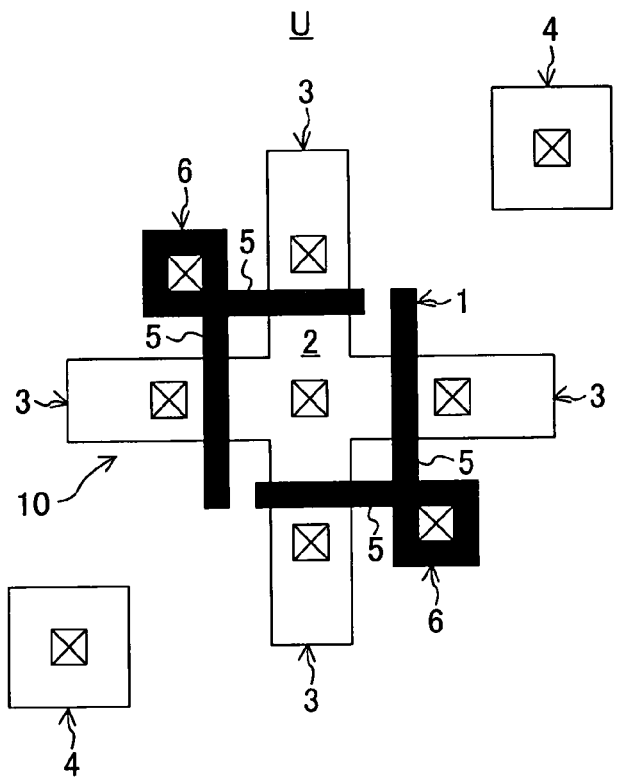
FIG. 13 is a plan view showing a third modified embodiment of the unit cell of the same MOSFET.
Figure 14:
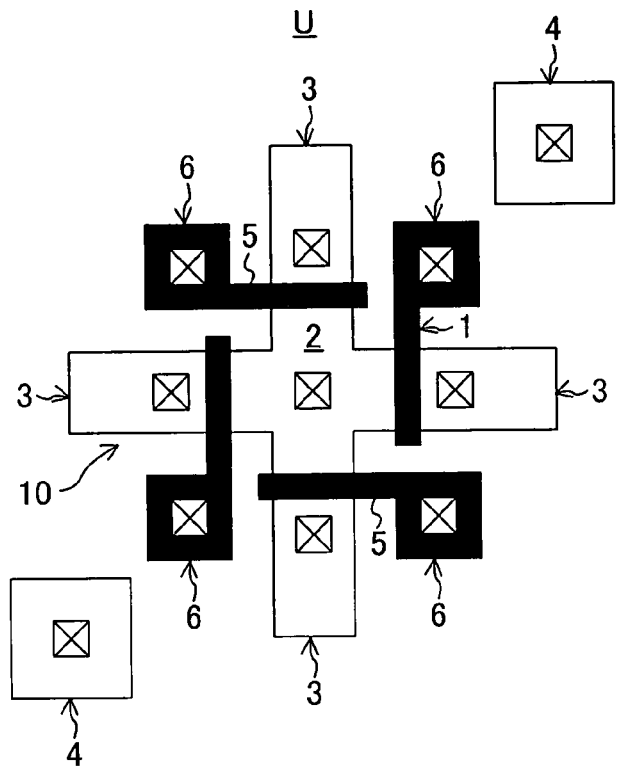
FIG. 14 is a plan view showing a fourth modified embodiment of the unit cell of the same MOSFET.
Figure 15:
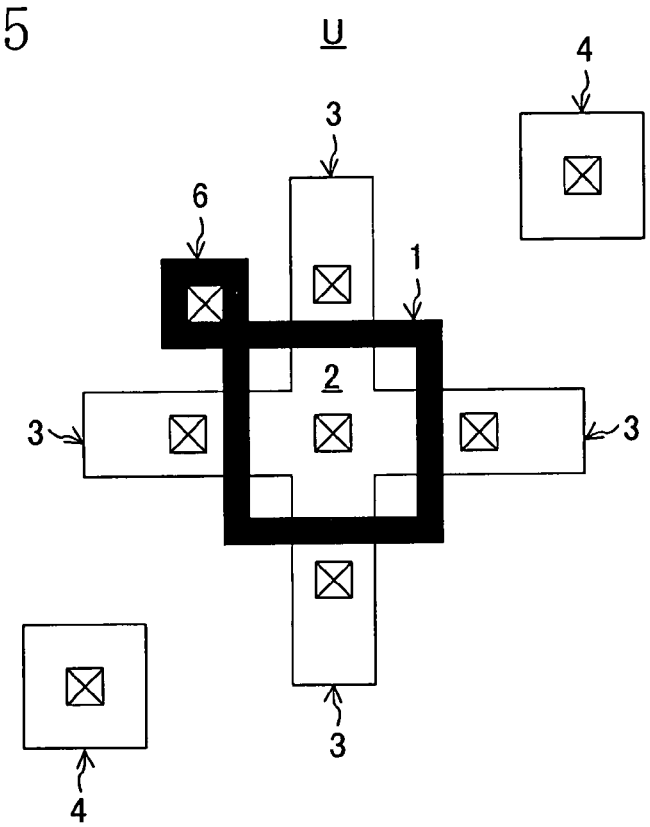
FIG. 15 is a plan view showing a fifth modified embodiment of the unit cell of the same MOSFET.

Further, in the above description, in the unit cell U, the shape of the gate electrode 1 is a completely closed ring-shaped quadrangle, but other various modifications can be made to the present invention. For example, as shown in FIG. 13, on the isolation region 10, two places of the quadrangle near the lower left corner and the upper right corner in the figure may be notched to thereby form the gate electrode 1 into a cut, open ring shape. As shown in FIG. 14, further on the isolation region 10, two more places of the quadrangle near the upper left corner and the lower right corner in the figure may be notched to thereby form the gate electrode 1 into an open ring shape with four cuts. In the unit cell U shown in FIG. 14, four sides of the open ring shape with four cuts are respectively connected to the gate contact pad portions 6 via the gate drawing wires 5. In addition, in the above description, the quadrangular gate electrode 1 is connected with the two gate contact pad portions 6, but the number of gate contact pad portions 6 to be connected thereto is not limited to two or four, but may be, for example, one as shown in FIG. 15.

Figure 16:
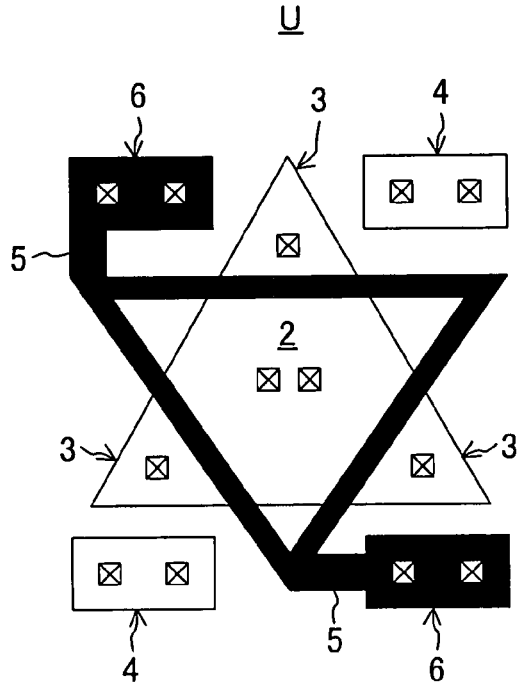
FIG. 16 is a plan view showing the first modified embodiment in which a ring-shaped gate electrode of the unit cell of the same MOSFET is triangle-shaped.
Figure 17:
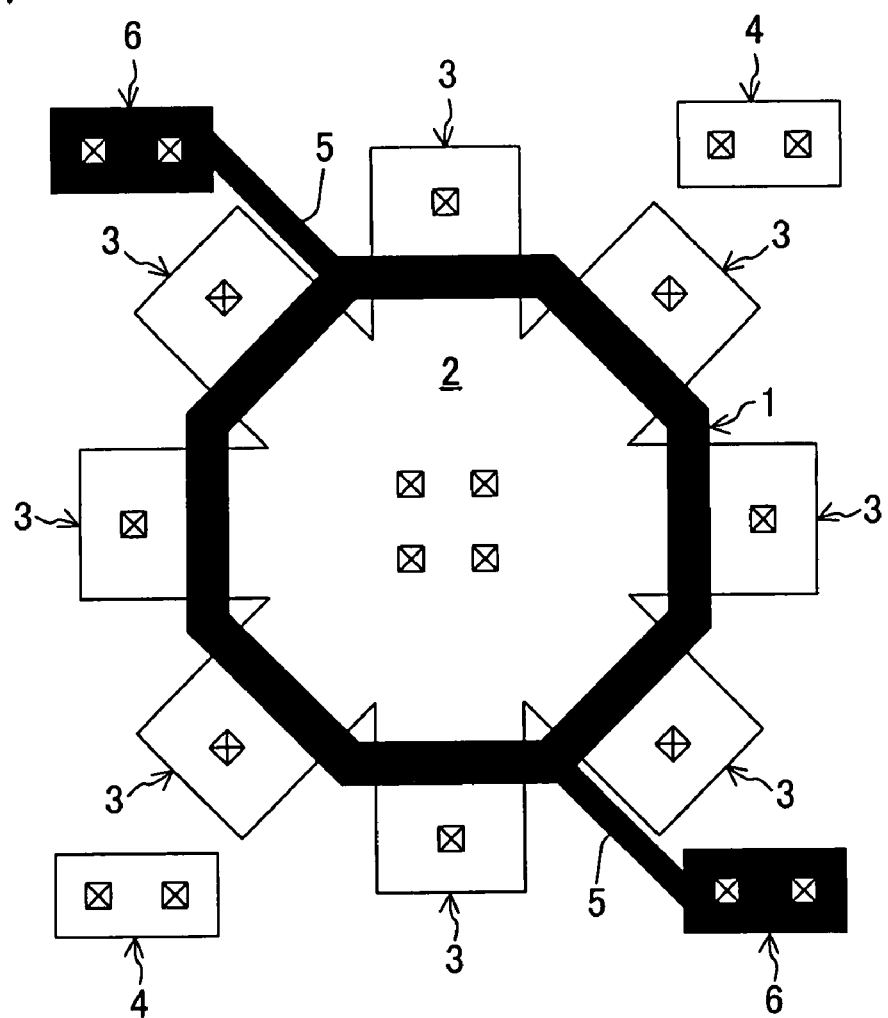
FIG. 17 is a plan view showing the first modified embodiment in which the ring-shaped gate electrode of the unit cell of the same MOSFET is octagon-shaped.
Figure 18:
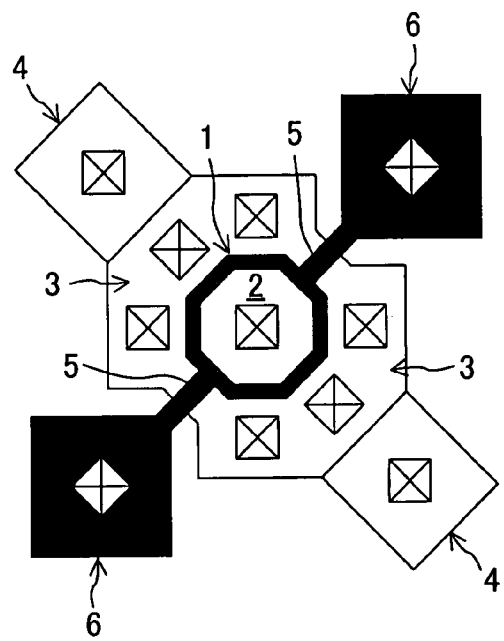
FIG. 18 is a plan view showing a general layout of a unit cell of a conventional MOSFET.
Figure 19:
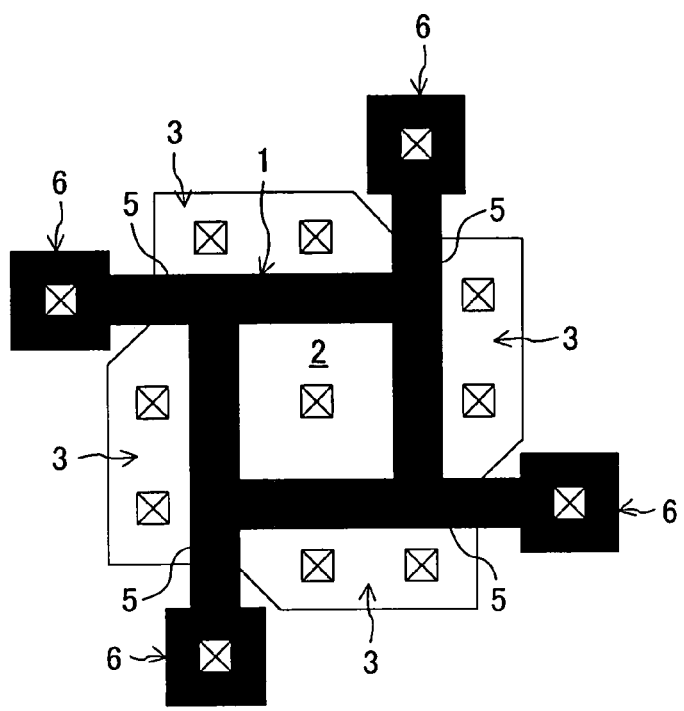
FIG. 19 is a plan view showing a general layout of another unit cell of the conventional MOSFET.

In addition, the shape of the ring-shaped gate electrode 1 in the unit cell U is not limited to a quadrangle, but other various modifications can be made thereto. FIG. 16 shows the ring-shaped gate electrode 1 which is triangle-shaped. FIG. 17 shows the ring-shaped gate electrode 1 which is octagon-shaped. For the octagonal gate electrode 1 shown in FIG. 17, compared to a gate electrode which is a triangle-shape or quadrangle-shaped, its shape is closer to a circle and a current flowing from the source region 3 to the drain region 2 is uniform, thus resulting in a smaller equivalent resistance value, which advantageously improves high frequency characteristics.

In the above description, in the unit cell U, the region inside of the ring-shaped gate electrode 1 is provided as the drain region 2 while the region outside thereof is provided as the source region 3. Inversely, it is of course possible that the region inside of the ring-shaped gate electrode 1 is provided as a source region while the region outside thereof is provided as a drain region.

What is claimed is:

1. A semiconductor device comprising a plurality of unit cells formed on a semiconductor substrate, each of the unit cells including:
    a ring-shaped gate electrode;
    a first diffusion region formed in a region inside of the ring-shaped gate electrode and serving as a drain region or a source region;
    a second diffusion region formed in a region outside of the ring-shaped gate electrode and serving as a source region or a drain region;
    an isolation region surrounding an active region formed by the first diffusion region and the second diffusion region when viewed in plan;
    a gate contact pad portion provided on the isolation region; and
    a gate drawing wire for connecting together the ring-shaped gate electrode and the gate contact pad portion,
    the ring-shaped gate electrode including a portion disposed on the active region and a portion disposed on a non-active region, the gate drawing wire being connected to the ring-shaped gate electrode by the portion disposed on the non-active region, and all of the gate drawing wire being arranged on the isolation region.

2. The semiconductor device according to claim 1, further comprising: a drain or source contact formed on the first diffusion region; a source or drain contact formed on the second diffusion region; and a gate contact formed on the gate contact pad portion.

3. The semiconductor device according to claim 1, wherein the ring-shaped gate electrode is formed into a completely closed ring shape.

4. The semiconductor device according to claim 1, wherein the ring-shaped gate electrode is cut on the isolation region to be thereby formed into an open ring shape.

5. The semiconductor device according to claim 1, wherein the unit cell further includes:
    a substrate contact semiconductor region whose conductive type is opposite to a conductive type of the first and second diffusion regions; and
    a substrate contact formed on the substrate contact semiconductor region.

6. The semiconductor device according to claim 2, wherein an area of the first diffusion region is set small such that only one drain or source contact can be formed on the first diffusion region and drawn out therefrom.

7. The semiconductor device according to claim 1, wherein the ring-shaped gate electrode has a bending portion.

8. The semiconductor device according to claim 7, wherein the bending portion of the ring-shaped gate electrode is located on the isolation region.

9. The semiconductor device according to claim 2, wherein a number of the source or drain contact formed on the second diffusion region is four or larger.

10. The semiconductor device according to claim 1, wherein an area of the second diffusion region is set larger than an area of the first diffusion region.

11. The semiconductor device according to claim 2, wherein an area of the gate contact pad portion is set large so that a plurality of gate contacts can be formed.

12. The semiconductor device according to claim 2, wherein an area of the gate contact pad portion is set small so that only a single gate contact can be formed.

13. The semiconductor device according to claim 1, wherein the ring-shaped gate electrode, the gate drawing wire, and the first and second diffusion regions in each unit cell are rotationally symmetrical about a center point of the ring-shaped gate electrode on the semiconductor substrate.

14. The semiconductor device according to claim 2, wherein:
    in each of the plurality of unit cells, two gate contact pad portions are formed at mutually opposing positions across the first diffusion region, and the gate drawing wire comprises two gate drawing wires connecting together the ring-shaped gate electrode and the two gate contact pad portions, and
    the plurality of unit cells are in orderly arrangement so that the semiconductor device as a whole has symmetry.

15. The semiconductor device according to claim 14, further comprising:
    substrate contact semiconductor regions formed at mutually opposing positions across the first diffusion region, the opposing positions being different from the positions of the two gate contact pad portions, the substrate contact semiconductor regions having a conductivity type opposite to a conductive type of the first and second diffusion regions; and
    substrate contacts formed on the substrate contact semiconductor regions.

16. The semiconductor device according to claim 14, wherein the ring-shaped gate electrode, the gate drawing wires, and the first and second diffusion regions in each unit cell are rotationally symmetrical about a center point of the ring-shaped gate electrode on the semiconductor substrate.

17. The semiconductor device according to claim 14, wherein at least one of the plurality of unit cells is arranged at a 90 degree rotation from an adjacent unit cell.

18. The semiconductor device according to claim 14, wherein:
    the source or drain contact comprises a plurality of source or drain contacts; and
    the semiconductor device further comprises a source or drain contact wire connecting together the source or drain contacts formed on the second diffusion region, the source or drain contact wire being formed over a region excluding the drain or source contact formed on the first diffusion region and a surrounding area thereof and the gate contact formed on the gate contact pad portions and a surrounding area thereof.

19. The semiconductor device according to claim 15, further comprising a source or drain contact-substrate contact wire connecting together the source or drain contact formed on the second diffusion region and the substrate contacts formed on the substrate contact semiconductor regions.

20. The semiconductor device according to claim 14, further comprising:
  substrate contact semiconductor regions provided only in some unit cells of the plurality of unit cells each located at a surrounding area of the semiconductor device, the substrate contact semiconductor regions having a conductive type opposite to a conductive type of the first and second diffusion regions;
  substrate contacts each formed on the substrate contact semiconductor regions; and
  a substrate contact wire connecting together the substrate contacts.

21. The semiconductor device according to claim 1, wherein the plurality of unit cells formed on the semiconductor substrate function as a high-frequency signal amplification FET.

* * * * *